United States Patent [19]
Mori et al.

[11] Patent Number: 4,765,735
[45] Date of Patent: Aug. 23, 1988

[54] METHOD OF MEASURING A MODE PARTITION CHARACTERISTICS OF A LASER DIODE AND AN APPARATUS OF THE SAME

[75] Inventors: Masakazu Mori, Kawasaki; Takashi Tsuda, Tokyo; Kazuo Yamane, Kawasaki, all of Japan

[73] Assignee: Fujitsu Limited, Kawasaki, Japan

[21] Appl. No.: 21,717

[22] Filed: Mar. 4, 1987

[30] Foreign Application Priority Data

Mar. 4, 1986 [JP] Japan ................... 61-045334

[51] Int. Cl.$^4$ .............................................. G01J 1/00
[52] U.S. Cl. ........................................................ 356/121
[58] Field of Search ........................................ 356/121

[56] References Cited

U.S. PATENT DOCUMENTS 4,698,817 10/1987 Burley ................................... 372/31

OTHER PUBLICATIONS

Fujitsu Sci. Tech. J., 21, 1, pp. 50–66 (Mar. 1985) article entitled "405 Mbit/s Single-Mode Optical Fiber Transmission System".

Iwashita et al, "Suppression of Mode Partition Noise by Laser Diode Light Injection", *IEEE Journal of Quantum Electronics*, vol. QE-18, No. 10, (Oct. 1982), pp. 1669–1674.

Iwashita et al, "Mode Partition Noise Characteristics in High-Speed Modulated Laser Diodes", *IEEE Journal of Quantum Electronics*, vol. QE-18, No. 12, (Dec. 1982), pp. 2000–2004.

*Primary Examiner*—R. A. Rosenberger
*Attorney, Agent, or Firm*—Staas & Halsey

[57] ABSTRACT

An apparatus and a method for measuring a mode partition characteristics of laser diode with so-called a k-value (k factor), in which the PN (Pseudo Noise) pulse pattern is used for modulation of laser diode to be measured on the occasion of measuring various parameters required for calculation of the k value.

8 Claims, 12 Drawing Sheets

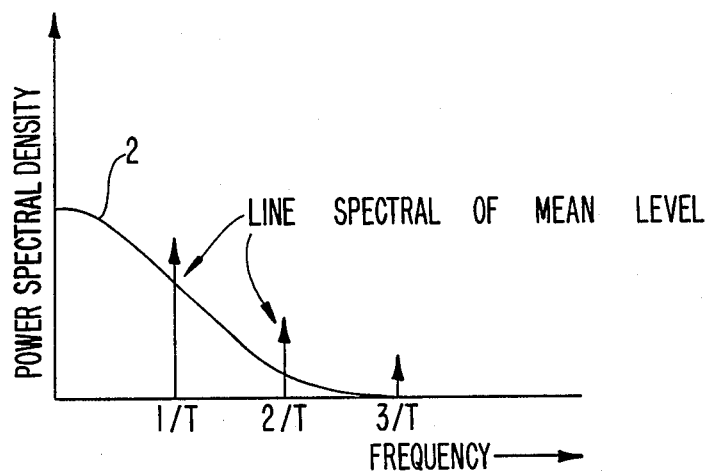
FIG. 8(B)
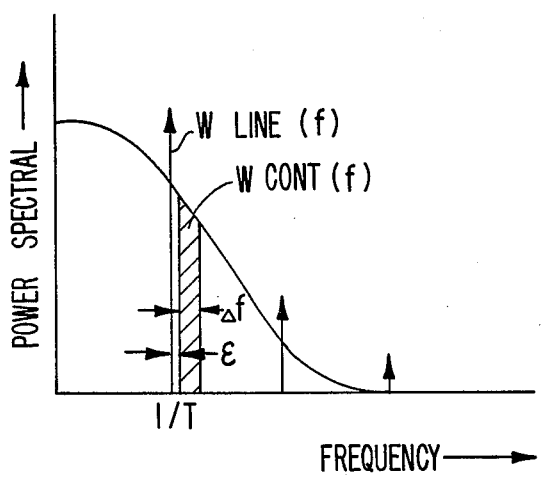
FIG. 9
FIG. 10
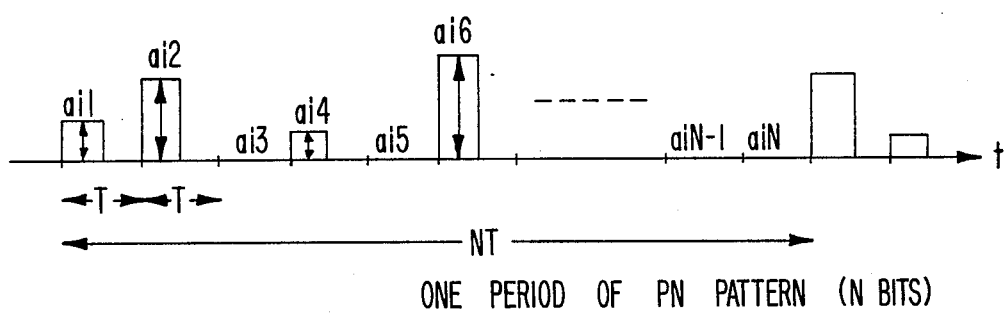

METHOD OF MEASURING A MODE PARTITION CHARACTERISTICS OF A LASER DIODE AND AN APPARATUS OF THE SAME

BACKGROUND OF THE INVENTION

The present invention relates to a method of measuring mode partition characteristics of a laser diode and an apparatus thereof.

Investigations for practical use of a high speed optical transmission system utilizing laser diode (LD) is recently progressing rapidly and therefore evaluation for optical transmission system is more and more considered as an important subject from the point of view of system design, etc.

In general, an output optical signal of a laser diode includes a plurality of wavelength elements, for example, $\lambda_0, \lambda_1, \lambda_2, \ldots$, as illustrated in FIG. 1(b) which show the spectra of output optical signal of a laser diode at times $t_0, t_1, t_2$. Each wavelength element is called longitudinal mode. In case an LD outputs the optical signals at the times $t_0, t_1, t_2$ corresponding to the data having a mark as illustrated in FIG. 1(a), if the three modes $\lambda_0, \lambda_1, \lambda_2$ exist, the total power $P_t$ of an optical signal is partitioned in such a manner as $P_0\%$ for $\lambda_0$, $P_1\%$ for $\lambda_1$, and $P_2\%$ for $\lambda_2$ ($P_0+P_1+P_2=100$) (Mode partitioning) However, when considering an individual optical signal corresponding to each binary data such as the PCM data, powers $P_0, P_1, P_2$ of each longitudinal mode are respectively different for each optical signal at the times $t_0, t_1, t_2$, and are dispersed along a certain distribution curve around the average values of $\bar{P}_0, \bar{P}_1$ and $\bar{P}_2$. This optical power partition to each longitudinal mode generates the noise called a mode partition noise. This noise is caused by fluctuation of the reaching time of each longitudinal mode at the receiving side. Namely, refractive index in the optical fiber is different in accordance with the wavelengths $\lambda_0, \lambda_1, \lambda_2, \ldots$ and therefore the reaching time at the receiving side is different for each wavelength. So the power ratio of each longitudinal mode is changed, received waveform sways, and after all data error rate increases. (When $\lambda_1 < \lambda_2$, the refractive index of $\lambda_2$ becomes larger and the reaching time becomes longer.) Therefore, it is very important for system design to know the degree of mode partition.

Particularly fluctuation of said reaching time is not negligible for high speed data transmission, for example, of 405 Mb/s, 810 Mb/s or optical transmission paths with longer repeater spacing. On the contrary, data transmission rate or repeater spacing can be limited in accordance with the mode partition. A sign for determining the mode partition character is so-called a k-value (k factor). The k-value is determined uniquely for each LD.

This k-value is defined as follows. When $P_T$ is total power, $P_i$ is optical power partitioned to the longitudinal mode of wavelength $\lambda_i$ and $\bar{P}_i$ is a mean value of $P_i$, the following relation can be obtained.

$$\overline{P_i^2} - \bar{P}_i^2 = P_T^2 \times (\xi) a_i (1-a_i)$$

$(\overline{P_i^2} - \bar{P}_i^2)$; dispersion

Where, $x(\xi) = 1/(1+\xi) = K^2$, $P_i = a_i P_T$, and $\xi$ is a mode partition constant Namely, a k-value is related to dispersion of optical power partitioned to each longitudinal mode. Therefore, partition of optical power to each longitudinal mode along the partition curve defined by this k-value changes for each laser pulse.

According to introducing a k-value, a ratio of the continuous spectral element $w_{cont}(f)$ (mode partition noise element) and line spectral element $w_{line}(f)$ of the received signal is given by the following equation (1).

$$w_{cont}(f)/w_{line}(f) = k^2(1 - \bar{a}_i/\bar{a}_i) \cdot T \cdot \Delta f \quad (1)$$

In the above equation (1),

① $k$ is a k-value of LD
② $\bar{a}_i$ is a relative intensity of i-th longitudinal mode in the spectrum of LD output optical signal $$\left( \text{therefore, } \sum_i \bar{a}_i = 1 \right)$$

③ T is a period of fixed pulse pattern
④ $\Delta f$ is a band width of selective level meter for measuring spectral element Here, $W_{cont}(f)$, $W_{line}(f)$ and $a_i$ are respectively measured by measuring instruments and a wanted k-value is obtained by substituting such values into the above equation (1). An example of practical values is as follows.

| k-value | Relative strength of longitudinal mode |
|---------|----------------------------------------|
| 0.36    | 0.55                                   |
| 0.29    | 0.12                                   |
| 0.25    | 0.071                                  |

As explained above modulation of LD is carried out with the fixed pattern in the conventional mode partition character measuring system. Namely, LD is driven using a fixed pulse pattern generator. As this fixed pulse pattern, "100100100 . . . ", for example, is used. One fixed pulse pattern is set, as explained above, based on the fact that above equation (1) can be guided easily and the line spectrum and continuous spectrum can be isolated very easily.

However, such single fixed pulse pattern is too intentional and is not practical. Therefore, here arises a problem that a k-value to be obtained is not always a believable value.

SUMMARY OF THE INVENTION

It is accordingly an object of the present invention to provide a measuring apparatus and a method for measuring mode partition characteristics of laser diode under the condition near the actual drive condition.

According to one aspect of the present invention, an apparatus is provided for measuring a mode partition characteristics of a laser diode comprising a first means driven by he clock signal of period T, for generating N bit-length of pseudo noise, an optoelectric conversion means including a laser diode to be measured, for outputting optical signal modulated by said pseudo noise pattern, a second means for separating a particular longitudinal mode from said optical signal, a third means for detecting power $P_i$ of said particular longitudinal mode, a fourth means for detecting a line spectral element $w_{line}(f)$ and continuous spectral element $w_{cont}(f)$' of said particular longitudinal mode, and a processing means for calculating a coefficient which indicates mode partition characteristics by obtaining a relative power $a_i$ of said particular longitudinal mode in all longitudinal modes, a ratio of line spectral element to continuous spectral element and a coefficient defined by a number of N-bits of pseudo noise.

According to another aspect of the present invention, a method of measuring mode partition characteristics of a laser diode is providing comprising the following steps; modulating said laser diode by pseudo noise with a period NT, measuring relative intensity of particular longitudinal mode in all longitudinal modes of output optical signal of said laser diode, measuring line spectral element and continuous spectral element of said particular longitudinal mode, and calculating a coefficient whch indicates a mode partition characteristics of said laser diode from measured values and a coefficient defined by N of pseudo noise.

BRIEF DESCRIPTION OF THE DRAWINGS

FIG. 7 illustrates the optical signal for all longitudinal modes;

FIG. 7(A) is a graph measured in the time domain; while

FIG. 8 illustrates an optical signal for particular longitudinal modes;

FIG. 8(A) is a graph measured in the time domain; while FIG. 8(B) is a graph measured in the frequency domain;

FIG. 9 is a pictorial presentation for explaining a ratio of continuous spectral intensity to line spectral intensity;

FIG. 10 is an example of the optical signal waveform of the particular longitudinal mode i;

DESCRIPTION OF THE PREFERRED EMBODIMENTS

Figure 1A:
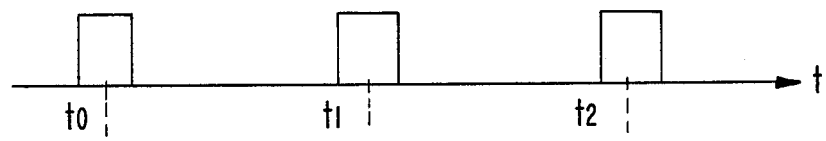
FIG. 1 is a pictorial presentation for explaining the mode partition of an L.D.
Figure 1B:
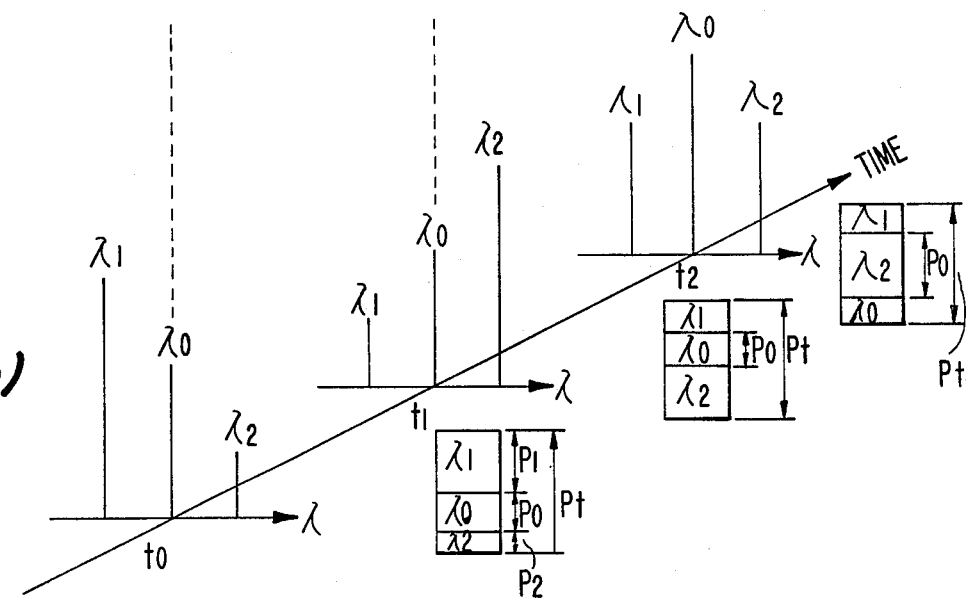
Figure 1C:
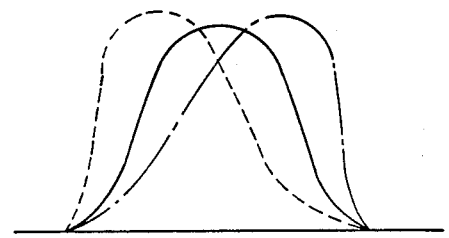

FIG. 1 illustrates a block diagram of an apparatus measuring mode partition characteristics of a laser diode where a PN pulse pattern is used for the LD modulation signal. Namely, an LD has been modulated by the fixed pulse pattern for measuring the k-value in the existing method, but in FIG. 1, the PN (Pseudo Noise) pulse pattern is utilized as an LD modulation signal. Use of PN pulse pattern reproduces the environment more similar to the actual data pattern and the k-value thus obtained is sufficiently believable. It should be noted here that the PN pulse pattern has been introduced as the pulse pattern in place of a simple random pulse pattern and fixed pulse pattern. Accordingly, in the mode partition characteristic measuring system, an LD modulated by the PN pulse pattern generator is remarkably unique.

In the mode partition characteristics measuring system to which the present invention pertains, as will be explained complementarily in greater detail, a k-value can be obtained from the following equations (2) and (3).

$$W_{cont}(f)/w_{line}(f) = k^2 \cdot (1-\overline{a_i})/\overline{a_i} \cdot T \cdot \Delta f \cdot 2N \qquad (2)$$

$(f \neq m/T$ (m is integer))

$$w_{cont}(f)/w_{line}(f) = k^2 \cdot (1-\overline{a_i})/\overline{a_i} \cdot T \cdot \Delta f \cdot 2N/(N+1) \qquad (3)$$

$(f = m/T$ and $G(m/T) \neq 0)$

Each letter and symbol have the same meaning as those in the equation (1) (where, T is bit period) and N is newly introduced. N is a bit length of one period of the PN pulse pattern. G(f) is the Fourier tranform of a received waveform of a modulated optical signal. Here, $w_{cont}(f)$, $w_{line}(f)$ and $a_i$ are measured respectively by the specified measuring instrument and a k-value can be obtained by substituting these values into the equation (2) or (3).

In comparison of the conventional equation (1) with above equations (2), (3) in relation to the present invention, it can be seen that there is no distinctive modification in the equation themselves even though the PN pulse pattern which is more complicated than the conventional fixed pulse is employed. This is because of focusing on periodicity of the self-correlation of the PN pulse pattern in the present invention and the equations (2), (3) which are not largely different from the equation (1) can be obtained by utilizing this periodicity. It will be proved theoretically later.

Figure 2A:
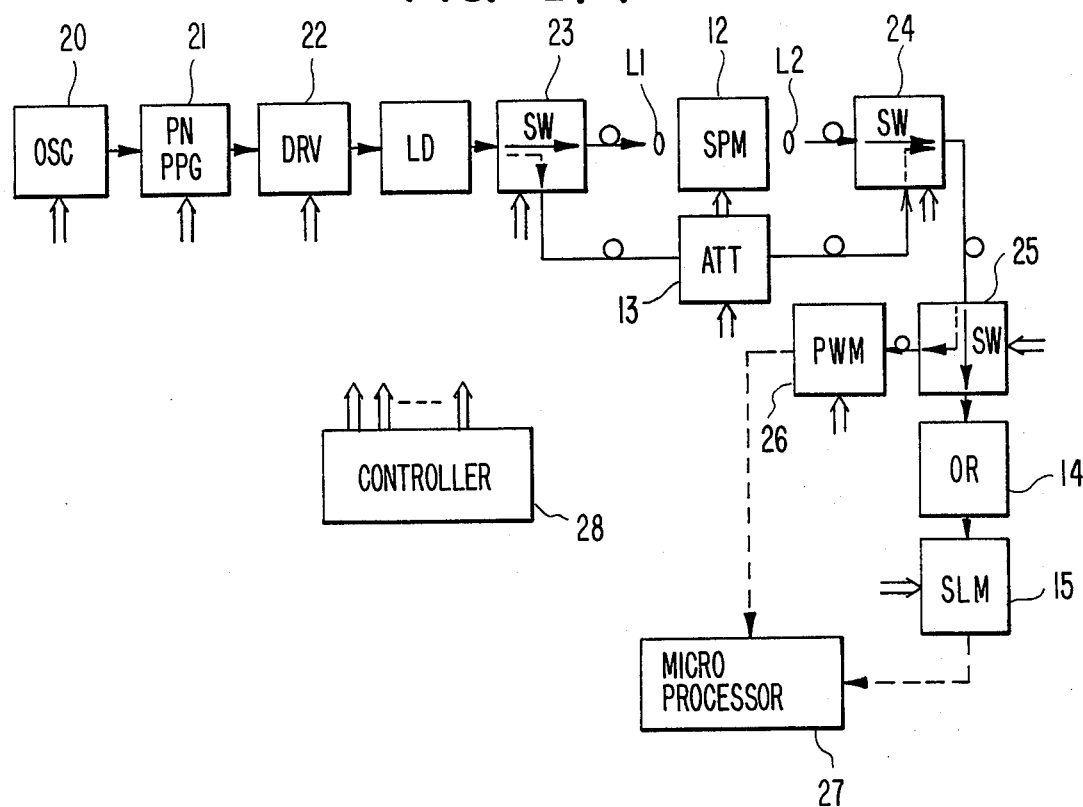
FIG. 2(a) is a block diagram of an apparatus for measuring a mode partition characteristics of a laser diode to which the present invention pertains.
Figure 3:
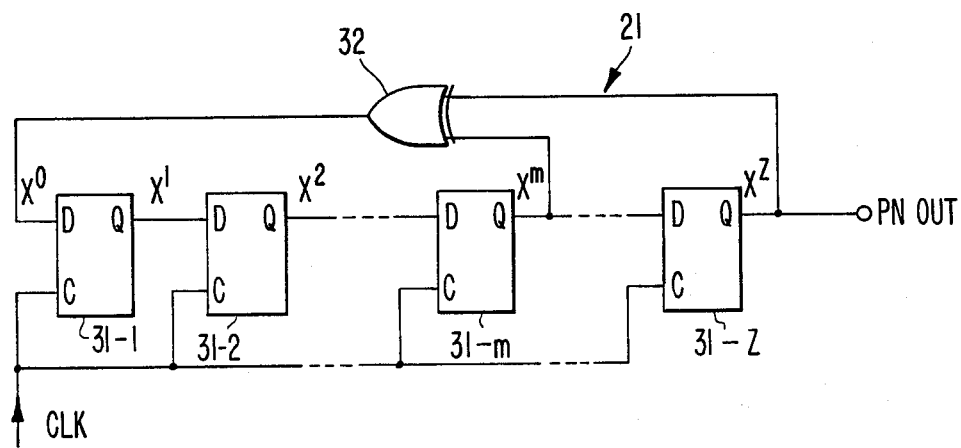
FIG. 3 illustrates an example of the PN pulse pattern generator.

FIG. 2(a) shows an apparatus for measuring mode partition characteristics of a laser diode in detail. In this figure, 12 is a spectrophotometer, 13 is an optical attenuator, 14 is an optoelectric converter, 15 is a selective level meter, 21 is a PN pulse pattern generator and LD is a laser diode. In order to assemble a measuring apparatus, an oscillator (OSC) 20 is first necessary. The oscillator 20 drives the PN pulse pattern generator 21. An example of this generator 21 is illustrated in FIG. 3 described later. A laser driver (DRV) 22 receives the PN pulse pattern and drives the laser diode LD to be measured, causing it to generate the optical signal modulated by PN pattern. This optical signal inputs a first optical switch (SW) 23 and it is herein switched to the first direction (arrow mark of solid line) or the second direction (arrow mark of dotted line). The optical signal divided to the first direction inputs to a spectrophotometer 12 and only the light element of particular longitudinal mode is output therefrom. L1, L2 provided in the preceding and succeeding stages of such spectrophotometer are optical systems such as lens, etc. Meanwhile, the PN modulated optical signal divided to the second direction is input to the optical attenuator 13.

The optical signal from the spectrophotometer 12 (first direction) and the optical attenuator 13 (second direction) are both arranged in the direction 1 by a second optical switch 24. The optical signal from the second optical switch 24 is directed again to the first and second directions. Namely, the third optical switch 25 guides the optical signal directed to the first direction (arrow mark of dotted line) to an optical power meter (PWM) 26, also guides the optical signal directed to the second direction (arrow mark of solid line) to the optoelectric converter (OR) 14. The optoelectric converter 14 receiving the optical signal converts it into an electrical signal and then applies it to the selection level meter (SLM) 15.

Except for the laser diode LD to be measured and the optoelectric converter 14, the various units (20, 21, 22, 23, 24, 25, 26, 12, 13, 15) are all driven and controlled by the specified timing by a controller 28. Particularly the drive timing control for first, second and third optical switches 23, 24, 25, optical power meter 26, spectrophotometer 12, optical attenuator 13 and selective level meter 15 is important for obtaining the required data. Namely, on the occasion of guiding a k-value with the arithmetic operations from the equations (2) and (3), necessary data $w_{cont}(f)$, $w_{line}(f)$ and $a_i$ are obtained under the control of controller 28. The data $w_{cont}(f)$ is finally obtained from the selective level meter 15 but since thermal noise and shot noise are subtracted from the continuous spectrum element of the output of the optoelectric converter 14, attenuation level is adjusted so that an input level at the converter 14 through the spectrophotometer 12 becomes equal to an input level at the converter 14 through optical attenuator 13. In this case, the drive timing control is required for the units 23, 24, 25, 26, 12 and 13. Moreover, on the occasion of attaining the data $a_i$ (defined freely as i=k), the drive timing of the units 23, 12, 24, 25 and 26 is controlled in order to read the first, second, ..., k-th, ... n-th optical powers $P_1, P_2, ..., P_k, ... P_n$ with power meter 26 respectively. Finally, $a_k$ can be obtained from $P_k/(P_1+P_2+ ... P_k+ ... P_n)$. This arithmetic operation is carried out by the data processing unit 27 indicated in the right lower part of FIG. 2(a). This data processing unit 27 is given $w_{cont}(f)$ and $w_{line}(f)$ as the input data and calculates a k-value. Therefore, it is preferable that the data processing unit 27 comprises a microprocessor.

Figure 2B:
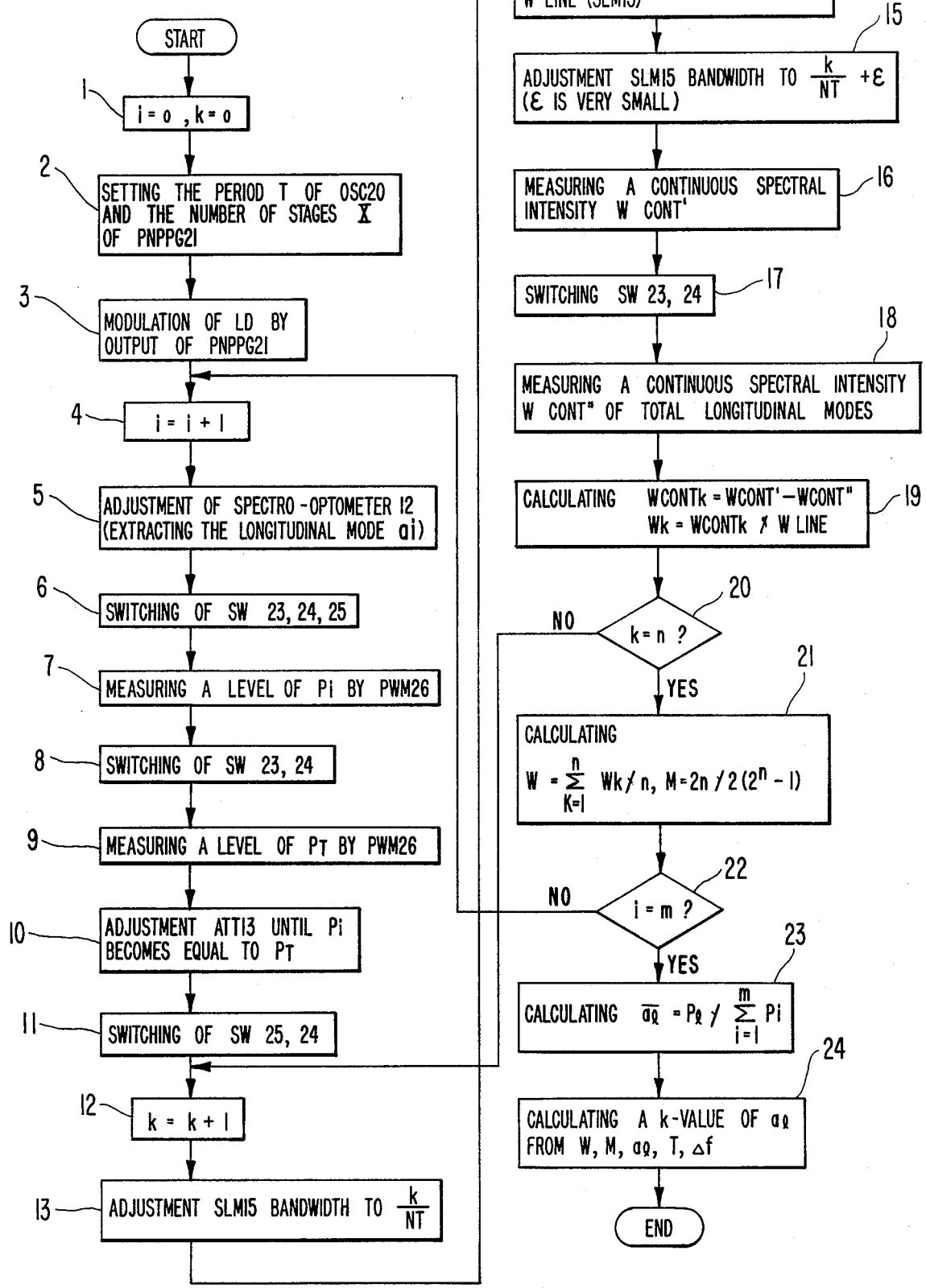
FIG. 2(b) is a flow chart for explaining control steps of FIG. 2(a)

FIG. 2(b) is a flowchart for explaining operations of the controller 28 and the processor 27.

In the step ②, the period T of clock generated by the OSC 20 and a number of stages z of PNPPG21 (a number of stages of FF illustrated in FIG. 3) are set to the processor 27.

In the step ⑤, the wavelength band of spectrophotometer 12 is adjusted and only the particular longitudinal mode $a_i$ of wavelength $\lambda_i$ is extracted from the output optical signal of LD.

In the step ⑥, the switches SW23, 24 are controlled to output the optical signal to the solid line side, while SW25 outputs the optical signal to the dotted line.

In the step ⑦, through the above switching control, an optical power $P_i$ of the particular longitudinal mode $a_i$ having passed the spectrophotometer 12 is measured by PWM26.

In the step ⑧, the switches SW23, 24 are switched to the dotted line side.

In the steps ⑨ and ⑩, attenuation level of ATT 13 is adjusted so that the level of the optical power $P_T$ of the longitudinal modes of LD having passed ATT13 becomes equal to that of $P_i$.

In the step ⑪, the switches 23, 24, 25 are switched again to the solid line side.

In the step ⑫, band of SLM15 is adjusted so that the frequency K/NT which is equal to K-times (K is integer) of the PN pattern frequency 1/NT can be set within the frequency band f of SLM15.

In the step ⑭, a measured value of SLM15 at the frequency K/NT is obtained. This measured value is the line spectral intensity $w_{line}$ of the longitudinal mode $a_i$.

In the step ⑮, the band of SLM15 is deviated by $+\epsilon$ ($+\epsilon$ is a small value) from K/NT in order to obtain the continuous spectral intensity $w_{cont}'$ near the line spectrum element.

In the step ⑯, a measured value of SLM15 near the frequency K/NT is obtained. This measured value becomes the continuous spectral intensity $w_{cont}'$ of the longitudinal mode $a_i$, but this value contains the spectrum of thermal noise and shot noise of OR14.

In the step ⑰, the switches SW23, 24 are switched to the dotted line side so that all longitudinal modes of the output optical signal of LD can pass through ATT13 ajdusted in the step ⑩.

In the step ⑱, a measured value of SLM15 at the frequency K/NT+$\epsilon$ can be obtained. This measured value is the continuous spectral intensity $w_{cont}''$ of total longitudinal modes and ATT13 is adjusted so that $P_i=P_T$.

In general, since the continuous spectrum element for all longitudinal modes results from thermal noise and shot noise, $w_{contk}$ given by $w_{contk}=w_{cont}'-w_{cont}''$ becomes the continuous spectrum element of longitudinal mode $a_i$ from which those of the thermal noise and shot noise are eliminated.

In the step ⑲, said $w_{contk}$ is calculated and a ratio $w_k$ of continuous spectral intensity $w_{contk}$ and line spectral intensity $w_{line}$ is also calculated.

Measured values of a plurality of line spectral intensities for longitudinal mode $a_i$ can be obtained by executing the processings at each frequency (1/NT, 2/NT, .., k/NT, ... n/NT) and also at the neighboring frequencies (1/NT+, 2/NT+, ... K/NT+, ... n/NT+) and thereby measured values of a plurality of continuous spectral intensities for the longitudinal mode $a_i$ can be obtained. Then, a mean value w of $w_k$ is obtained. In this case, measurement is executed at the frequency for $w_{line} > w_{cont}'$. This is because SLM15 cannot separate the line spectrum and the continuous spectrum when $w_{line} < w_{cont}'$.

Then, a marking rate $M=(N+1)/2N=2^z/2$ $(2^z-1)$ of PN pattern corresponding to the equation (3) is obtained (step ㉑).

Moreover, above processings are executed for each longitudinal mode $(a_1, a_2, ..., a_i, ..., a_m)$ and thereby relative intensity $\bar{a}_i$ of $P_i$ for the power $$\left( \sum_{l=1}^{m} P \right)$$

of total longitudinal modes (step ㉓).

In the step ㉔, a value measured and calculated in each step is substituted into the equation (3) in order to obtain a k-value of the particular longitudinal mode.

FIG. 3 is an example of PN pulse pattern generator and is already known. When a period of PN pulse pattern is N-bit length, the D-flip-flops 31-1, 31-2, ... 31-m, ..., 31-z of z stages are cascade-connected and each stage is driven by the oscillator (OSC) 20 to form the z-stage shift register. Moreover, the specified PN pulse pattern output $PN_{out}$ can be obtained by feeding back the output of the m stage and that of the final stage (z stage) to the initial stage through the EXOR gate 32. Various kinds of patterns of PN pulse can be selected in accordance with selection of an intermediate stage (m stage) from which outputs feed back to the gate 32. The FIG. 3 illustrates the structure of primitive polynomial $X^n + X^m + 1$.

Figure 4:
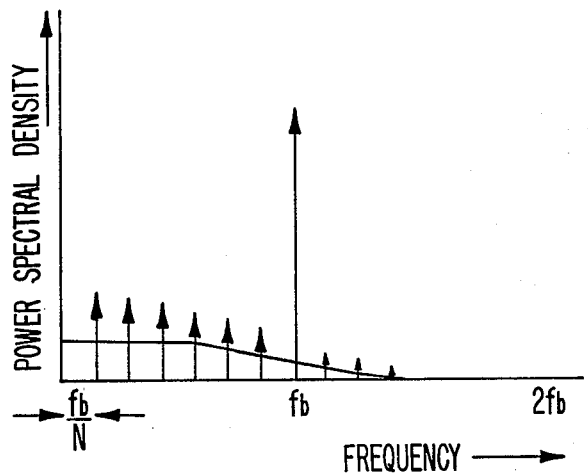
FIG. 4 indicates power spectral density of the received optical output modulated by the PN pattern.

FIG. 4 is a diagram illustrating power spectral density of output optical signal of LD modulated by PN pattern. The horizontal axis represents frequency, while the longitudinal axis power spectral density. Various conditions for obtaining this diagram are that the PN pattern is RZ (return to zero), a number of stages of shift register (z) in FIG. 3 is 3 (PN3) and frequency ($f_b$) of PN pattern is 405 Mb/s. Therefore, T in the equations (2), (3) is $1/f_b$. In addition, $f_b/N$ in the lower left in FIG. 4 is an interval $f_b/N$ per bit. N is a bit length of a period of PN pulse pattern as described previously (in this case, $N = 2^3 - 1 = 7$).

Figure 5:
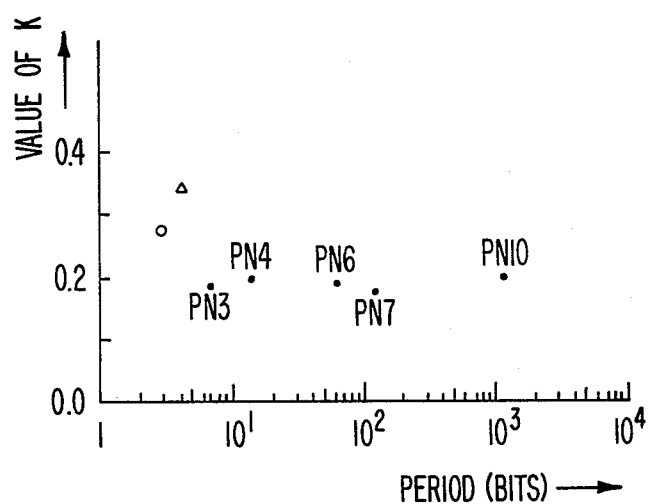
FIG. 5 illustrates the result of measuring k-value.

FIG. 5 illustrates measuring result of k-value, particularly searching dependency on the number of stages of PN. PN3, PN4, ... given to the data marked by a block circle indicates three stages, four stages, ... In addition, the measuring frequency of a selective level meter is from 135 MHz to 175 MHz. Meanwhile, the data with white circles and triangles have been obtained by the conventional method (fixed pulse pattern) and the data with white circle has been obtained using the fixed pattern of (100100 . . . ) while the data with triangle obtained using the fixed pattern of (10001000 . . . ). As indicated in this figure, these data are smaller than the data obtained using the fixed pattern irrespective of a number of stages of PN. This means that a value of k which is a little larger than the actual k-value has been measured in the conventional method.

Figure 6:
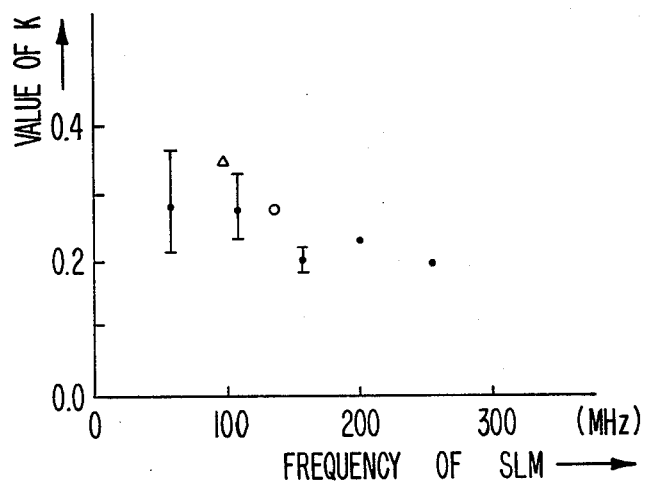
FIG. 6 illustrates the result of measuring k-value.

FIG. 6 illustrates a result of measurement of k-value. Particularly, variations of measured value in case the measuring frequency (frequency of selective level meter) is changed have been searched for PN10. The white circle data and triangle data in the same figure are similar to that in FIG. 5. Hereinafter, the concept of the present invention will be explained in greater detail in comparison with the conventional method.

A k-value can generally be measured by the method in the time domain or by the method in the frequency domain. The former is difficult because a particular unit such as a sampling unit is necessary. Accordingly it is preferable to measure the k-value by the latter method. The measuring system of the present invention (FIG. 1) corresponds to the latter method. Discussion will be made hereinafter to the conventional method where the PPG output is employed as the fixed pattern and the method of the present invention where it is employed as the PN pattern.

METHOD BY FIXED PULSE PATTERN (CONVENTIONAL METHOD)

Figure 7A:
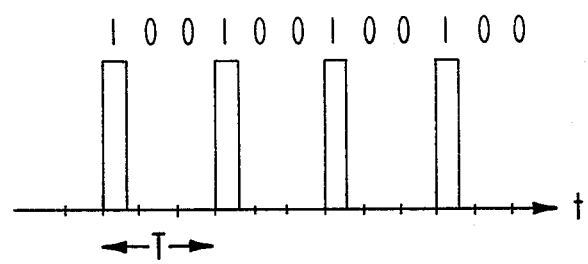
Figure 7B:
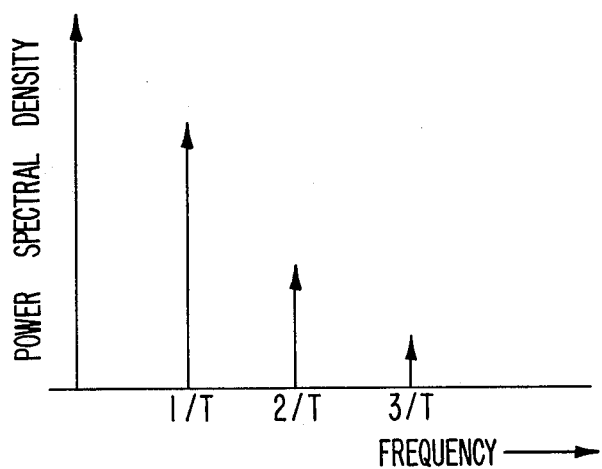
FIG. 7(B) is a graph measured in the frequency domain.
Figure 8A:
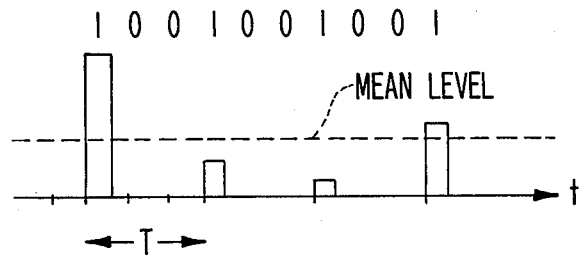

For simplification, considered here is the case where PPG output is set to the fixed pulse pattern to which the mark ("1") of 1 bit is entered within one period. In this case, the pulse amplitude of all longitudinal mode optical outputs of LD do not change with time, but when only the optical output of a particular longitudinal mode is extracted, the pulse amplitude thereof as a whole sways. The continuous spectrum by such swaying element is indicated as the curve 2 of FIG. 8(B) described later. FIG. 8 and FIG. 7 indicate comparison of optical outputs for the fixed pulse pattern (100100 . . . ).

FIG. 7 illustrates optical outputs of all longitudinal modes; (A) is a graph measured in the time domain while (B) is measured in the frequency domain.

FIG. 8 illustrates optical outputs of a particular longitudinal mode; (A) is a graph measured in the time domain while (B) is measured in the frequency domain. The perpendicular arrow mark of FIG. 8(B) is the line spectrum by means element of the particular longitudinal mode level.

When thinking in the frequency domain, only the line spectrum element exists in the optical outputs of all longitudinal modes, but the continuous spectrum element by sway is also added to such line spectrum in the optical outputs of the particular longitudinal modes. A value k can be obtained as described below by measuring a ratio of such line spectrum element and the continuous spectrum element.

The line spectrum element $w_{line}(f)$ and continuous spectrum element $w_{cont}(f)$ in case only the i-th longitudinal mode among the n-longitudinal modes of optical signal spectrum is extracted can be obtained as indicated by the following equations where the probability P ($a_i$; $\alpha_i$, $\beta_i$) for optical level of i-th longitudinal mode becomes $a_i$ times (normalized intensity of the i-th longitudinal mdoe, $0 < a_i < 1$) of the optical levels of all longitudinal modes is considered as the coefficient of the delta function indicating the line spectrum.

$$w_{line}(f) = \qquad (4)$$

$$\frac{1}{T^2} \sum_{n=-\infty}^{\infty} \left| \int_0^1 P(a_i; \alpha_i, \beta_i) \cdot G_{a_i}(f) \cdot da_i \right|^2 \cdot$$

$$\delta\left(f - \frac{n}{T}\right) = \frac{1}{T^2} \sum_{n=-\infty}^{\infty} \left| \int_0^1 P(a_i; \alpha_i, \beta_i) a_i \cdot da_i \right|^2 =$$

$$\frac{\overline{(a_i)}^2}{T^2} \sum_{n=-\infty}^{\infty} |G_1(f)|^2 \cdot \delta\left(f - \frac{n}{T}\right)$$

$$\left( \because \left| \int_0^1 P(a_i; \alpha_i, \beta_i) a_i \cdot da_i \right|^2 = \overline{(a_i)}^2 \right);$$

$\overline{a_i}$: a mean value of $a_i$ $\delta(f-(n/T))$; a delta function and indicates the line spectrum corresponding to frequencies $1/T, 2/T, \ldots n/T$ in FIG. 7.

$G_1(f)$; Fourier's transform of optical output waveforms all longitudinal modes $G_{ai}(f)$; Fourier's transform of optical output waveforms when optical output of i-th longitudinal mode is $a_i$ times of the optical outputs of all longitudinal modes, $G_{ai}(f) = a_i \cdot G_1(f)$ In addition, $$P(a_i; \alpha_i, \beta_i) = \frac{a_i^{\alpha_i-1}(1-a_i)^{\beta_i-1}}{\beta(\alpha_i, \beta_i)} \text{ ; beta distribution}$$

Wherein, $\beta(\alpha_i, \beta_i) = \int_0^1 t^{\alpha_i-1}(t-1)^{\beta_i-1}dt$ $\alpha_i = \xi \overline{a_i}$ $\beta_i = \xi(1-\overline{a_i})$ $\xi$: mode partition constant ($k^2 = 1/(\xi+1)$)

Therefore, the equation (4) indicates strength of the line spectrum $w_{line}(n/T)$ in FIG. 7.

Meanwhile, the continuous spectral element can be obtained as the dispersion of $G_{ai}$, and $$w_{cont}(f) = \frac{1}{T}\left\{\int_0^1 P(a_i; \alpha_i, \beta_i) \cdot |G_{ai}(f)|^2 da_i\right.$$
$$\left. - \frac{1}{T}\left|\int_0^1 P(a_i; \alpha_i, \beta_i) \cdot G_{ai}(f) da_i\right|^2\right.$$
$$= \frac{1}{T}\left\{\int_0^1 P(a_i; \alpha_i, \beta_i) \cdot a_i^2 \cdot da_i\right.$$
$$\left. - \left(\int_0^1 P(a_i; \alpha_i, \beta_i) \cdot a_i \cdot da_i\right)^2\right\} \cdot |G_1(f)|^2$$

(the first item is $(\overline{a_i})^2$, the second item is $\overline{a_i}$)

$$= \{\overline{a_i^2} - (\overline{a_i})^2\} \frac{|G_1(f)|^2}{T}$$

Here, $\overline{a_i^2} - (\overline{a_i})^2$ indicates dispersion of $a_i$. Moreover, from the property of beta distribution, $$\overline{a_i^2} - (\overline{a_i})^2 = \frac{1}{1+\xi}\overline{a_i}(1-\overline{a_i}) \tag{5}$$

$$= K^2 \overline{a_i}(1-\overline{a_i})$$

$$\therefore w_{cont}(f) = K^2 \overline{a_i}(1-\overline{a_i})\frac{|G_1(f)|^2}{T}$$

Therefore, as illustrated in FIG. 9, taking a ratio of the line spectral intensity of the particular line spectral frequency $n/T$ to the neighboring continuous spectral intensity, from the equations (4), (5), $$\frac{w_{cont}(f)}{w_{line}(f)} = \frac{\int_{f_{line}+\epsilon-\frac{\Delta f}{2}}^{f_{line}+\epsilon+\frac{\Delta f}{2}} w_{cont}(f)df}{\int_{f_{line}-\frac{\Delta f}{2}}^{f_{line}+\frac{\Delta f}{2}} w_{line}(f)df} \tag{6}$$

$$= \frac{K^2 \overline{a_i}(1-\overline{a_i})\frac{|G_1(f_{line})|^2}{T}\Delta f}{\frac{(\overline{a_i})^2}{T^2}|G_1(f_{line})|^2}$$

$$= K^2 \cdot \frac{1-\overline{a_i}}{\overline{a_i}} \cdot T \cdot \Delta f$$

Here, $\Delta f$ is the bandwidth of selective level meter (SLM) and $\epsilon$ is the frequency deviation of selective level meter from line spectral frequency corresponding to the continuous spectral to be obtained.

This is because the band width of the selective level meter must be deviated by $\epsilon$ from the line spectral frequency on the occasion of measuring the continuous spectrum since the line spectrum and continuous spectrum are indicated in overlap and these cannot be discriminated in the selective level meter. From the equation (6), a k-value can be obtained since other parameters may be obtained by measurement.

FIG. 9 is a pictorial presentation for explaining a ratio of continuous spectral intensity to line spectral intensity.

Only one mark is given in the one period of pattern, the formula (1) can be adopted. For example, the formula (6) can be adopted for the patterns such as
100100100 ...
101010 ...
1111 ....

In actual measurement, since thermal noise and shot noise are added to the continuous spectrum, these must be separated. This purpose can be satisfied by obtaining differences of continuous spectrum elements in the cases where the optical output of all longitudinal modes are applied in the same optical input level and the optical input of single longitudinal mode is applied.

METHOD BY PN PULSE PATTERN (PRESENT INVENTION)

The method of measuring k-value by the fixed pulse pattern provides a problem that the measurement is carried out under the condition different from that of actual use. Namely, the data modulating LD is a random pattern under the acutal condition for use. Therefore, a measurement utilizing the PN pulse pattern will then be discussed in detail. The principle is the same as the case where the fixed pulse pattern is used. For guidance of the equation (6) using the fixed pattern, $a_i$ has been treated as the single dimensional numerical value corresponding to a number of wavelength spectrums because only one mark is given to one period, but when the PN pattern is used, the above equation (6) cannot be used because a number of marks in one period of PN pattern is not always one.

With reference to FIG. 10 which illustrates an example of the optical output waveform of the particular longitudinal mode i, NT corresponds to the one period PN pulse pattern (N bit length, $N = 2^z - 1$ in the case of Z-stages of flip-flop circuits). The optical output waveform of the particular longitudinal mode i is given in FIG. 10 and in this case the waveform of the one period of PN is defined as $PNA_i(t)$. Where $A_i$ indicates a pair of $(a_{i1}, a_{i2}, \ldots, a_{iN})$. Here, the power partition of each bit is considered to be independent as in the case of the fixed pattern. Moreover, definition is made as follow.

$$P_{rob}(A_i) = \prod_{l=1}^{N} P_{ro}(a_{il}) \quad (P_{rob}: \text{Probability})$$

$$\int dA_i = \int da_{i1}\, da_{i2} \ldots da_{iN}$$

$$F\{PNA_i(t)\} = GPNA_i(f)$$

$1/T \to 1/NT$ (frequency in unit of 1 bit of PN pattern)

In this case, power spectral density w(f) of optical output waveform is given by the following equation.

$$w(f) = w_{cont}(f) + w_{line}(f) \qquad (7)$$

Here, $$w_{cont}(f) = \frac{1}{NT} \int P_{rob}(A_i) |GPNA_i(f)|^2 dA_i$$
$$- \frac{1}{NT} \left| \int P_{rob}(A_i) |GPNA_i(f)| dA_i \right|$$

$$w_{line}(f) = \frac{1}{(NT)^2} \sum_{n=-\infty}^{\infty} \left| \int P_{rob}(A_i) \times GPNA_i(f) dA_i \right|^2 \cdot \delta\left(f - \frac{n}{NT}\right)$$

Next, each term of the equation (7) is calculated as follow.

$$PNA_i(t) = \sum_{l=1}^{N} b_l a_{il} g(t - lT)$$

Here,
b: 1 when the l-th bit is mark or 0 when the l-th bit is space
$g(t-lT)$: optical output waveform of all longitudinal modes of l-th bit $$\therefore GPNA_i(f) = F\{PNA_i(t)\}$$
$$= \sum_{l=1}^{N} b_l a_{il} G(f)\, e^{-j2\pi flT}$$

From the above relation, $$w_{cont}(f) = 1/NT \left\{ \sum_{l=1}^{N} b_l \overline{a_{il}^2} |G_1(f)|^2 + \sum_{l=1}^{N}\sum_{l'\neq l} b_l b_{l'} \overline{a_{il} a_{il'}} \times \right.$$

$$|G_l(f)|^2 \cdot e^{j2\pi f(l-l')T} - \frac{1}{NT} \left\{ \sum_{l=1}^{N} b_l (\overline{a_{il}})^2 |G_l(f)|^2 + \right.$$

$$\sum_{l=1}^{N}\sum_{l'\neq l} b_l b_{l'} \overline{a_{il}}\,\overline{a_{il'}} \times |G_1(f)|^2 + e^{-j2\pi f(l-l')T} =$$

$$\frac{1}{NT} \sum_{l=1}^{N} b_l \{\overline{a_{il}^2} - (\overline{a_{il}})^2\} |G_1(f)|^2$$

Here, since the power partition can be thought to be independent for any bit, $$\overline{a_{il}^2} - (\overline{a_{il}})^2 = \overline{a_i^2} - (\overline{a_i})^2$$

$$\therefore w_{cont}(f) = \{\overline{a_i^2} - (\overline{a_i})^2\} \cdot \frac{\sum_{l=1}^{n} b_l}{N} \cdot \frac{|G_1(f)|^2}{T}$$

Since $$\sum_{l=1}^{N} b_l/N$$

is a mark rate (M) of one period of PN pattern, if $$\sum_{l=1}^{N} b_l/N$$

is defined as M, $$w_{cont}(f) = \{\overline{a_i^2} - (\overline{a_i})^2\} M \frac{|G_1(f)|^2}{T} \qquad (8)$$
$$= K^2 \overline{a_i}(1 - \overline{a_i}) M \frac{|G_1(f)|^2}{T}$$

On the other hand, the line spectrum element $w_{line}(f)$ is $$F^{-1}\{\int P_{rob}(A_i)\, G_1 PNA_i(f)\, dA_i\} = \int P_{rob}(A_i)\, PNA_i(t)\, dA_i =$$

$$\sum_{l=1}^{N} b_l \overline{a_{il}} g(t - lT) = a_i \cdot PN(t)$$

Where, $$PN(t) = \sum_{l=1}^{N} b_l g(t - lT);$$

for one period of PN pulse pattern of all modes $$\therefore w_{line}(f) = \sum_{n=-\infty}^{\infty} \left| \frac{a_i \sum_{l=1}^{N} b_l G_1(f)\, e^{-j2\pi flT}}{NT} \right|^2 \delta\left(f - \frac{\eta}{NT}\right) \qquad (9)$$

$$= (\overline{a_i})^2 \sum_{n=-\infty}^{\infty} |C_n|^2 \cdot \delta\left(f - \frac{1}{NT}\right)$$

Wherein $$C_n = 1/NT\, G_1\left(\frac{n}{NT}\right) \sum_{l=1}^{N} b_l \cdot e^{\frac{-j2\pi nl}{T}}$$

and the nth order complex Fourier expansion coefficient of PN(t).

Figure 11:
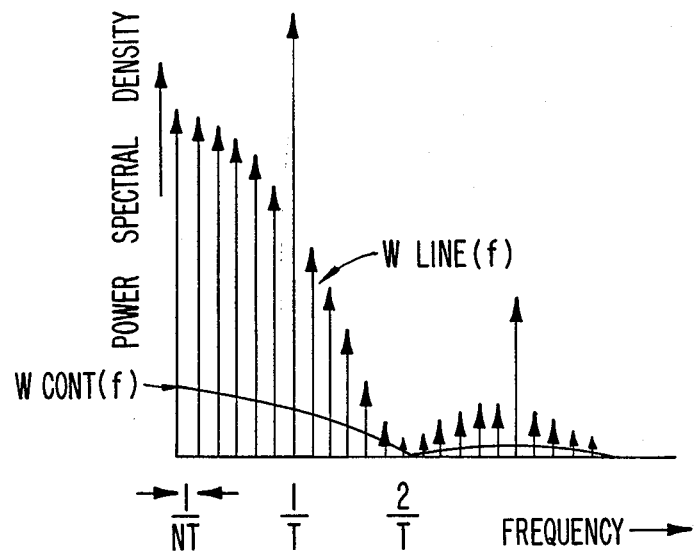
FIG. 11 is a power spectrum of a mode partition noise in the PN modulation.

FIG. 11 illustrates power spectrum of mode partition noise in PN modulation. Where the RZ pulse is used. The concept of $w_{cont}(f)$ and $w_{line}(f)$ can be attained from FIG. 11.

As in the case of the fixed pulse pattern, when a ratio of line spectral intensity $w_{line}(f)$ of line spectrum frequency $f_{line}$ to the continuous spectral intensity near $f_{line}$ is obtained, from above formulae (8) and (9), $$w_{cont}(f)/w_{line}(f) = \frac{\int_{f_{line}+\epsilon-\frac{\Delta f}{2}}^{f_{line}+\epsilon+\frac{\Delta f}{2}} w_{cont}(f)df}{\int_{f_{line}-\frac{\Delta f}{2}}^{f_{line}+\frac{\Delta f}{2}} w_{line}(f)df}$$

$$= k^2 \frac{1-\overline{a_i}}{\overline{a_i}} \cdot T \cdot \Delta f \cdot \frac{M/R \left| \sum_{l=1}^{N} b_l e^{-j\frac{2\pi nl}{N}} \right|^2}{N}$$

Where, $f_{line} = n/NT$.
Here, when m is an integer, $$\left| \frac{\sum_{l=1}^{N} b_l \cdot e^{j\frac{2\pi nl}{N}}}{N} \right|^2 = M^2 (f_{line} \text{ is } m/NT \text{ and } G_1(m/NT) \neq 0) \quad (11)$$

$$\approx M(1-M)/N \ (f_{line} \neq m/NT)$$

$m \to \infty$; a number of stages of PN is infinite)

Above equation (11) is an approximate value when the number of stages of PN is infinite. This equation (11) will be proved later.

Next, a power spectral density (line spectrum) of the PN series (PN pulse pattern) is obtained and when a number of stages of PN series is large, it comes close to the power spectral density of the perfectly random binary code series (actual data) and may be reviewed as the actual data by using the PN series and above equation (11) is also effective when a number of stages of PN is finite.

As illustrated in FIG. 3, it is here considered that an output is obtained from the Q side of the shift register which is formed in accordance with the primitive polynomial as the PN series.

In this case, the mark ratio M of output is defined by the following relation when a number of bits of one period is considered as N.

$$N = 2^z - 1$$

Where, z is a number of stages of flip-flops.

$$M = (N+1)/2N (P \approx \frac{1}{2} \text{ when } N >> 1)$$

For better outlook, the PN series forming an output as the impulse is considered and then the PN series of the desired output waveform is also cosidered (FIG. 3 is the PN series of the NRZ output waveform).

The majority of the result obtained here can also be adopted to the PN series of desired mark ratio when a number of stages of PN is large.

(b) PN impulse series

Figure 12:
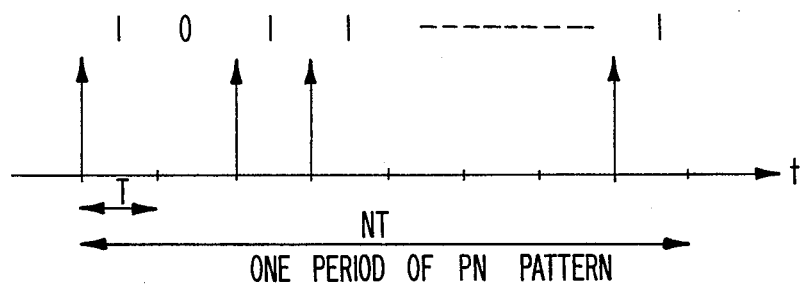
FIG. 12 illustrates the PN impulse series.

Here, the period of one bit in the PN series is defined as T and a bit length as N. In this case, the PN impulse series can be developed to the Fourier series where the frequency is an integer times of 1/NT. FIG. 12 illustrates the PN impulse series. The one period of PN impulse series is written as $PN_i(t)$ and is expressed by the following equation.

$$PN_i(t) = \sum_{i=1}^{N} a_i \cdot \delta(t - iT) \quad (12)$$

Here,
$a_i$;
1 when the i-th time slot is marked
0 when the i-th time slot is space
$\delta(t)$;
Delta function of Dirac When the equation (12) is expanded into the Fourier series, the nth expansion coefficient $C_n$ is expressed as follow.

$$C_n = \frac{1}{NT} \int_0^{NT} PN_i(t) \cdot \exp\left(-j\frac{2\pi nt}{NT}\right) dt$$

$$= \frac{1}{NT} \left\{ \sum_{i=1}^{N} a_i \cdot \exp\left(-j\frac{2\pi ni}{N}\right) \right\}$$

$$= \frac{1}{NT} \sum_{i=1}^{N} a_i \cdot \exp\left(-j\frac{2\pi ni}{N}\right)$$

The power spectrum density $w_{PNi}(f)$ of the PN impulse series can be obtained as indicated below.

$$w_{PNi}(f) = \sum_{n=-\infty}^{\infty} C_n \cdot C_n^* \cdot \delta(f - 1/NT);$$

here $C_n^*$ is the conjugate comples of $C_n$

Next, the power spectrum density is obtained using the self-correlation function of the PN series.

Figure 13:
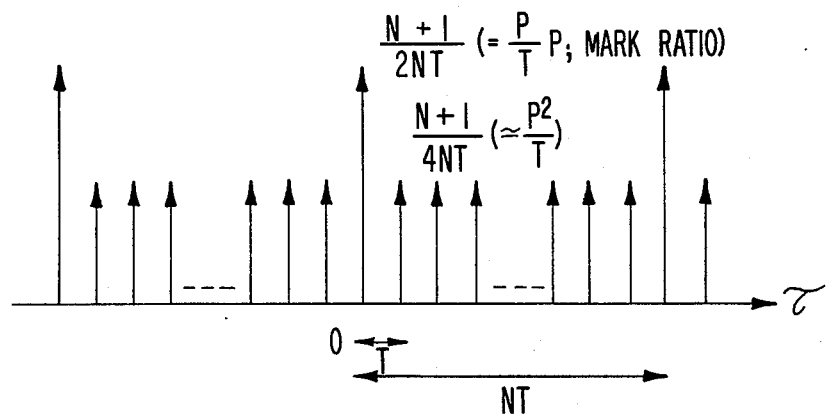
FIG. 13 illustrates a self-correlation function of the PN impulse series.

The self-correlation function $\phi_{ii}(\tau)$ is indicated in FIG. 13 due to the property of PN series.

Namely, $$\phi_{ii}(\tau) = \sum_{l=-\infty}^{\infty} \frac{N+1}{2N} \cdot \frac{1}{T} \delta(\tau - lT) +$$

$$\sum_{m=-\infty}^{\infty} \frac{N+1}{4N} \cdot \frac{1}{T} \delta(\tau - mNT)$$

Where, T is the period of one bit of PN. Therefore, $\phi_{ii}(\tau)$ can be expanded into the Fourier series where the frequency is an integer multiple of 1/NT.

$$\phi_{ii}(\tau) = \sum_{n=-\infty}^{\infty} f_n \cdot \exp\left(j\frac{2\pi n\tau}{NT}\right)$$

Here, the section (0, NT) of one period of PN is replaced with $(-\epsilon, NT-\epsilon)$ for integration of the delta function. From the formula of reverse conversion of the Fourier integral, $$f_n = \frac{1}{NT} \int_{-\epsilon_2}^{NT-\epsilon} \phi_{ii}(\tau) \cdot \exp\left(j\frac{2\pi n\tau}{NT}\right) dt \quad (13)$$

$$= \begin{cases} (N+1)^2/4(NT)^2 & \text{when } n = KN \ (K \text{ is an integer}) \\ (N+1)/4(NT)^2 & \text{when } n \approx KN \end{cases}$$

Depending on the theory of Wiener-Khintchine, the power spectrum density $w_{PNi}(f)$ is equal to the Fourier transform of the self-correlation function $\phi_{ii}(\tau)$. Accordingly, $$w_{PNi}(f) = F^{-1}\{\phi_{ii}(\tau)\} \qquad (14)$$

$$= \int_{-\infty}^{\infty} \sum_{n=-\infty}^{\infty} f_n \cdot \exp\left(j\frac{2\pi n \tau}{NT}\right) \exp(j2\pi f \tau) d\tau$$

$$= \sum_{n=-\infty}^{\infty} f_n \delta\left(f + \frac{n}{NT}\right)$$

$$w_{PNi}(f) = \sum_{n=-\infty}^{\infty} f_n \delta\left(f - \frac{n}{NT}\right)$$

Figure 14:
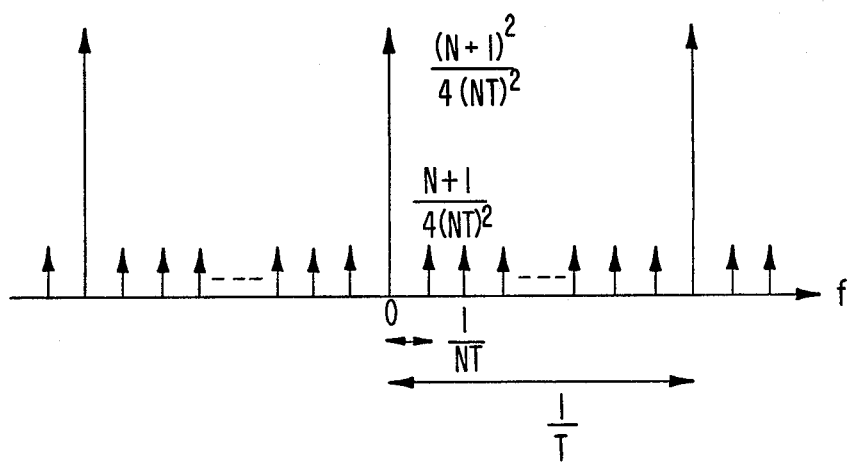
FIG. 14 illustrates a power spectral density of the PN impulse series.

Here, the power spectral density of PN impulse series is illustrated in FIG. 14.

In comparison with the equation (14), $$C_n \cdot C_n^* = f_n \qquad (20)$$

Namely, $$|C_n|^2 = \left|\frac{\sum_{i=1}^{N} a_i \cdot \exp\left(-j\frac{2\pi n i}{N}\right)}{NT}\right|^2$$

$$= \begin{cases} (N+1)^2/4(NT)^2 = (N+1)^2/4(NT)^2 \times (1/T^2) \\ M^2/T^2 \text{ (when } n = KN, K \text{ is an integer)} \\ (N+1)/4(NT)^2 = M(1-M)/N \times (1/T^2) \\ \text{(when } n \neq KN) \end{cases}$$

Namely, the equation (11) has been proved.

(c) PN series of ordinary waveform

Figure 15:
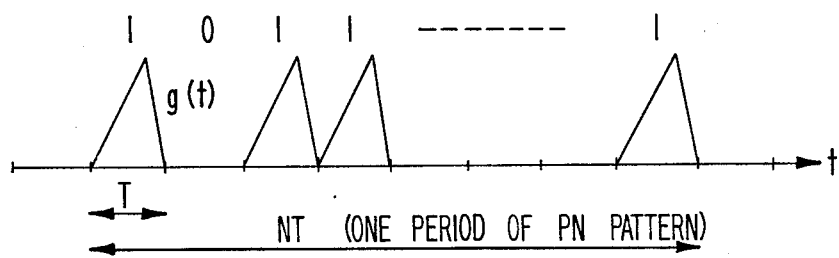
FIG. 15 illustrates the PN series of an ordinary waveform.

FIG. 15 is the PN series of an ordinary waveform. Here, one bit of marked waveform is considered as g(t), the PN(t) of one period of PN is expressed as follow.

$$PN(t) = \sum_{i=1}^{N} a_i \cdot g(t - iT)$$

The nth order Fourier expansion coefficient $h_n$ is expressed as follows.

$$h_n = \frac{1}{NT} \int_T^{(N+1)T} PN(t) \cdot \exp\left(-j\frac{2\pi nt}{NT}\right) \qquad (17)$$

$$= \frac{1}{NT} \sum_{i=1}^{N} a_i \int_{iT}^{(i+1)T} g(t - iT) \cdot \exp\left(-j\frac{2\pi nt}{NT}\right) dt$$

$$= \frac{1}{NT} \sum_{i=1}^{N} a_i G\left(\frac{n}{NT}\right) \exp\left(-j\frac{2\pi ni}{NT}\right)$$

Where, $G(f) = F\{g(t)\}$ and the intersymbol interference is considered not to exist. From the equations (17) and (15), $$h_n = c_n \cdot G(n/NT) \qquad (18)$$

Therefore, power spectrum density $w_{PN}(f)$ is expressed as follows.

$$w_{PN}(f) = \sum_{n=-\infty}^{\infty} h_n \cdot h_n^* \delta(f - n/NT) \qquad (19)$$

$$= \{(N+1)^2/4N^2T^2\}G(f)G(f)^* \sum_{k=-\infty}^{\infty} \delta(f - k/T) +$$

$$\{(N+1)4N^2T^2\}G(f)G(f)^* \sum_{n \neq kN} \delta(f - n/NT)$$

Figure 16:
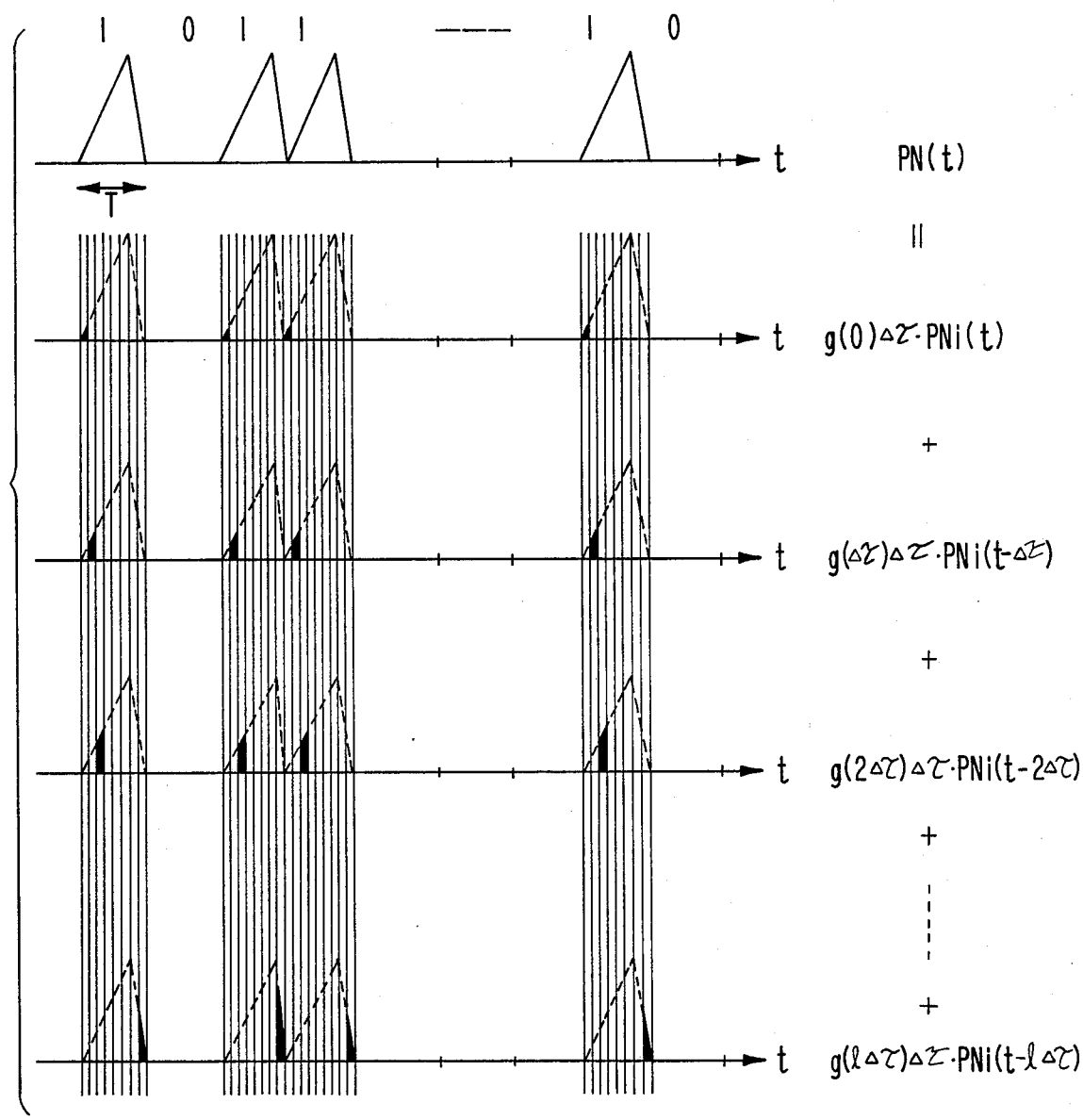
FIG. 16 illustrates the PN series of an ordinary waveform by disassembling it into sum of the PN impulse series.

Above equation (18) can be understood directly by thinking of it as illustrated in FIG. 16. FIG. 16 illustrates the PN series of an ordinary waveform in such a form as disassembled sums of the PN impulse series.

From FIG. 16, $$PN(t) = \lim_{\Delta \tau \to 0} \sum_{m=0}^{l} g(m\Delta \tau) \Delta \tau \cdot \qquad (20)$$

$$PN_i(t - m\Delta \tau)i(l+1)\Delta \tau = T$$

$$= \int_0^T g(\tau) PN_i(t_o - \tau) d\tau$$

$$\therefore F\{PN(t)\} = F\{g(t)\}F\{PN_i(t)\}$$

$$(F\{g(t)\} = G(f))$$

Equation (18) can be guided immediately from the above relation.

From above formulae (18), (20), $$w_{PN}(f) = |G(f)|^2 w_{PNi}(f) \qquad (21)$$

Figure 17:
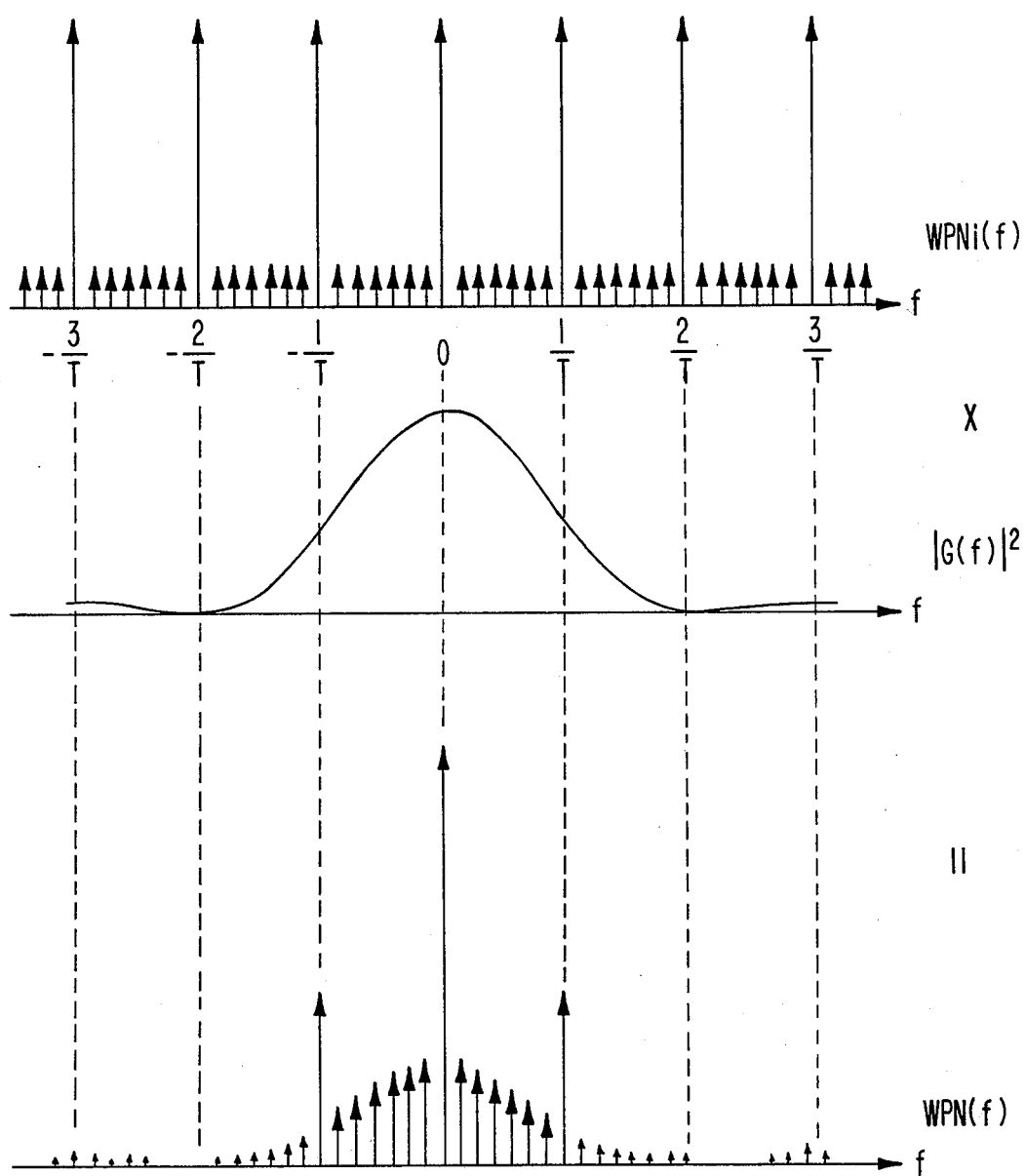
FIG. 17 is outline of the power spectral density of PN series of RZ pulse.

FIG. 17 illustrates the outline of the power spectrum density of the PN series of RZ pulse. Where, this figure corresponds to the case of three stages of PN.

(d) A number of stages of PN is infinite (check of result)

Figure 18:
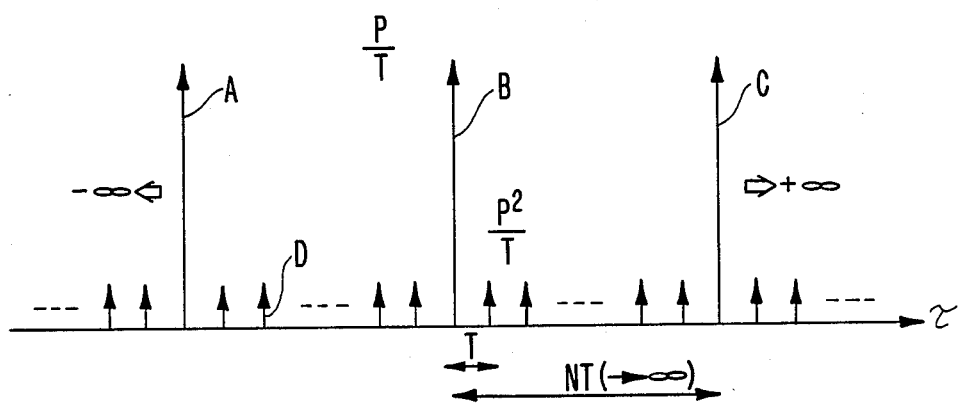
FIG. 18 is a self-correlation function when a number of stages of PN is infinite.

In this case, the self-correlation function $\phi_{ii}(\tau)$ of the PN impulse series is as indicated in FIG. 18. FIG. 18 illustrates the self-correlation function when the stages of PN is considered as infinite.

Since this is a sum of the $(M^2/T) \times \delta(\tau)$ train of the period T and the $(M(1-M)/T) \times \delta(\tau)$ train of the period NT, $$\phi_{ii}(\tau) = \sum_{l=-\infty}^{\infty} (M^2/T)/\delta(\tau - lt) +$$

$$\sum_{m=-\infty}^{\infty} (M(1-M)/T)/\delta(\tau - mNT)$$

In the right side of the above formula, the first item is the timing element (corresponding to the short arrow mark group D between the arrow marks A to C of FIG. 18) and the second item is the element to be transfered to the continuous spectrum. It can be expressed by the Fourier series as indicated below.

$$\sum_{k=-\infty}^{\infty} \delta(\tau - kT) = \frac{1}{T} \sum_{k=-\infty}^{\infty} \exp\left(j\frac{2\pi k\tau}{t}\right) \qquad (22)$$

Therefore, $$\phi_{ii}(\tau) = \frac{M^2}{T^2} \sum_{l=-\infty}^{\infty} \exp\left(j\frac{2\pi l\tau}{T}\right)$$

-continued $$+ \frac{M(1-M)}{NT^2} \sum_{m=-\infty}^{\infty} \exp\left(j\frac{2\pi m\tau}{NT}\right)$$

Accordingly, $$w_{PN}(f) = F\{\phi_i(\tau)\} = \frac{M^2}{T^2} \sum_{l=-\infty}^{\infty} \delta\left(f - \frac{l}{T}\right)$$

$$+ \frac{M(1-M)}{NT^2} \sum_{m=-\infty}^{\infty} \delta\left(f - \frac{m}{NT}\right)$$

Figure 19:
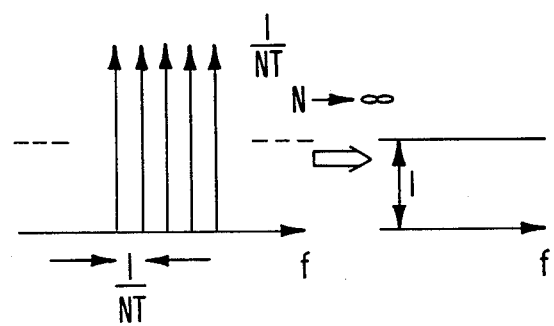
FIG. 19 is a diagram for the development of an equation.

Here, if N is considered as infinite (refer to FIG. 19), $$\lim_{N\to\infty} (1/NT) \sum_{n=-\infty}^{\infty} \delta(f - m/NT) = 1 \quad (23)$$

therefore, $$\lim_{N\to\infty} w_{PN}(f) = (M^2/T^2) \sum_{l=-\infty}^{\infty} \delta(f - l/T); \text{ line spectrum}$$

$$+ (M(1-M)/T); \text{ continuous spectrum}$$

In the case of PN series of the ordinary waveform, the above relation can be transformed as follows using said formula (20).

$$\lim_{N\to\infty} w_{PN}(f) = (M^2/T^2)G(f)G(f)^* \sum_{l=-\infty}^{\infty} \delta(f - l/T) \quad (24)$$

$$+ \{(M(1-M))/T\}G(f)G(f)^*$$

This is equal to power spectrum density of independent binary code series.

(e) In case N is finite.

Figure 20A:
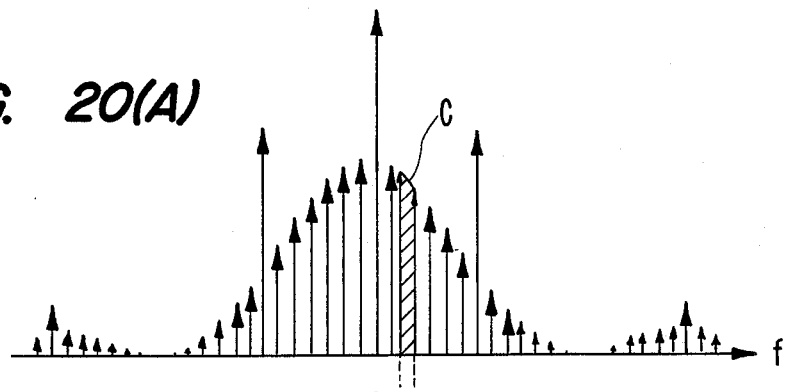
FIG. 20 illustrates the transfer from the line spectrum to continuous spectrum from the line spectrum for the RZ output waveform.
Figure 20B:
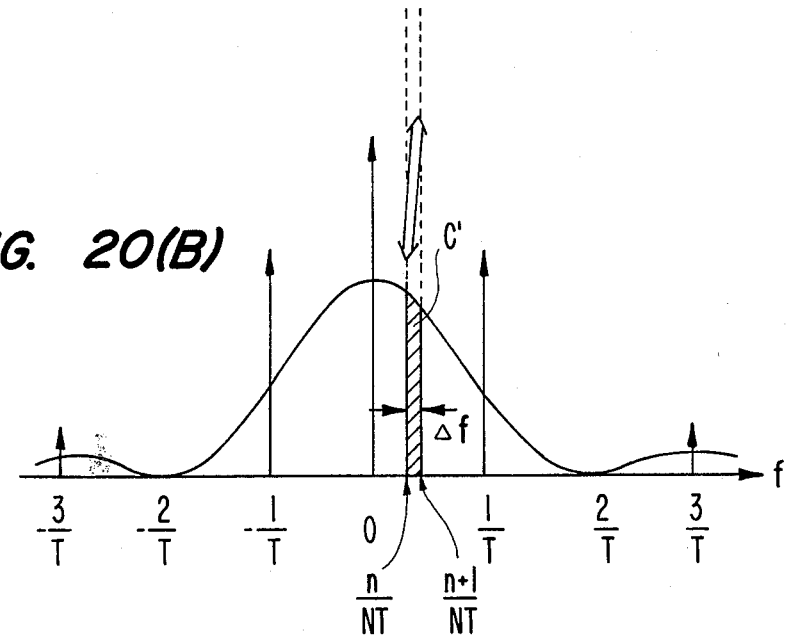

Relation of power spectrum density when a number of stages of PN transfers to infinite from finite for the PN series of RZ pulses is illustrated in FIG. 20. In FIG. 20(A), the number of stages of PN is finite and in FIG. 20(B), this is perfectly random.

As illustrated in FIG. 20, the area C' by the perfectly random continuous spectrum in the section (n/NT, n+1/NT) (n≠KN, k is an integer) is almost equal to the area C surrounded by the line spectrum at n/NT and n+1/NT in case the number of stages of PN is finite.

Here, if $\Delta f = 1/NT$, from the formula (24), $$C' = w_{PNcont}(n/NT) \cdot \Delta f = \{(M(1-M))/T\}|G(n/NT)|^2 \cdot \Delta f$$

Also from the formula (21), $$C = w_{PN}(n/NT) \cdot \Delta f = w_{PNi}(n/NT)|G(f)|^2 \Delta f$$
$$= C_n \cdot C_n^* G(f) \cdot \Delta f$$

Therefore, the following relation must be obtained.

$$\lim_{n\to\infty} |C/C'| = \lim_{n\to\infty} |(C_n'C_n)^*/[\{(M(1-M))/T\} \cdot \Delta f]| = /$$

When the following calculation is carried out actually to each PN series, $$C_n \cdot C_n^*/[\{(M(1-M))/T\} \cdot \Delta f](n \neq kN, \Delta f = 1/NT)$$

the following result can be obtained as summarized in the following table (comparison of power spectrum density). Accordingly, the power spectrum density of the PN series can be obtained using the perfectly random code power spectral density.

TABLE

| No. of stages of PN | Primitive polynomial | $C_n C_n^*/[\{M(1-M)/T\} \cdot \Delta f]$ |
|---|---|---|
| 3 | $X^3 + X + 1$ | 1.16667 |
| 4 | $X^4 + X + 1$ | 1.07142 |
| 6 | $X^6 + X + 1$ | 1.01612 |
| 7 | $X^7 + X^3 + 1$ | 1.00793 |
| 10 | $X^{10} + X^3 + 1$ | 1.00097 |

Therefore, the formula (1) is approximated by the power spectrum density in case the number of stages of PN is infinite, but it has a high accuracy even as the power spectrum density of the PN series in each number of stages.

When a number of stages of PN is infinite, the power spectrum density can also be reviewed as the binary code series. Therefore, a k-value obtained from the formula (11) matches the condition to the case where LD is modulated by the perfectly random binary code series.

What is claimed is:

1. An apparatus for measuring mode partition characteristics of a laser diode comprising:
   first means, driven by a clock signal having a period T, for generating an N-bit-length pseudo noise pattern;
   optoelectric conversion means, including a laser diode to be measured, for outputting an optical signal modulated by said pseudo noise pattern;
   second means for separating a particular longitudinal mode from the optical signal;
   third means for detecting a power $P_i$ of said particular longitudinal mode;
   fourth means for detecting a line spectral element $w_{line}(f)$ and continuous spectral element $w_{cont}(f)'$ of said particular longitudinal mode; and
   processing means, for calculating a coefficient which indicates mode partition characteristics by obtaining a relative power $a_i$ of said particular longitudinal mode in all longitudinal modes, a ratio of line spectral elements to continuous spectral elements and a coefficient defined by a number of N bits of pseudo noise.

2. An apparatus for measuring mode partition characteristics of a laser diode according to claim 1, wherein said processor obtains a value of k for said coefficient which indicates the mode partition characteristics by the following equation:

$$w_{cont}(f)/w_{line}(f) = K^2 \cdot \frac{(1 - \overline{a_i})}{a_i} \cdot T \cdot \Delta f \cdot \frac{2N}{N+1}$$

wherein $\Delta f$ is the bandwidth of said fourth means.

3. An apparatus for measuring mode partition characteristics of a laser diode according to claim 2, further comprising means for attenuating the optical signal of total longitudinal modes so as to match the level of power $P_i$ of said particular longitudinal mode, wherein;
   a continuous spectrum element $w_{cont}(f)''$ of attenuated all longitudinal modes is measured by said fourth means; and
   said processing means employs a value obtained by subtracting the continuous spectrum element $w_{cont}(f)''$ of said total longitudinal modes from the continuous spectrum element $w_{cont}(f)'$ of said particular longitudinal mode as a value of a continuous spectral element $w_{contk}(f)$.

4. An apparatus for measuring mode partition characteristics of a laser diode according to claim 2, wherein
   power $P_i$ of each longitudinal mode included in said laser beam is measured by said second means and said third means, and
   said processor obtains said relative intensity $a_i$ from a ratio of the sum of powers of each longitudinal mode to a power $P_i$ of the particular longitudinal mode.

5. An apparatus for measuring mode partition characteristics of a laser diode according to claim 2, wherein
   said fourth means detects the line spectrum $w_{line}(f)$ at the frequency which is an integer times of the frequency 1/NT and also detects the continuous spectrum element $w_{cont}(f)'$ and $w_{cont}(f)''$ at the neighboring frequency of an integer times of frequency 1/NT.

6. A method of measuring mode partition characteristics of a laser diode comprising the steps of:
   (a) modulating the laser diode by pseudo noise having a period NT;
   (b) measuring relative intensity of a particular longitudinal mode in all longitudinal mode of an output optical signal of the laser diode;
   (c) measuring line spectral element and continuous spectral element of the particular longitudinal mode; and
   (d) calculating a coefficient which indicates mode partition characteristics of the laser diode from measured values and a coefficient N of pseudo noise.

7. A method of measuring mode partition characteristics of a laser diode according to claim 6, wherein said step (c) of measuring continuous spectral element includes the substep of subtracting the continuous spectral element of total longitudinal modes.

8. A method of measuring mode partition characteristics of a laser diode according to claim 7, wherein said step (c) of measuring line spectrum includes the substep of measuring line spectrum at the frequency integer times of 1/NT, and
   said measuring the continuous spectrum element at the neighboring frequency of that integer times of 1/NT.

* * * * *

UNITED STATES PATENT AND TRADEMARK OFFICE
CERTIFICATE OF CORRECTION

PATENT NO. : 4,765,735

DATED : AUGUST 23, 1988

INVENTOR(S) : MASAKAZU MORI ET AL.

It is certified that error appears in the above-identified patent and that said Letters Patent is hereby corrected as shown below:

Col. 1, line 27, "partitioning) However," should be --partitioning). However,--.

Col. 2, line 56, "he" should be --the--.

Col. 3, line 6, "providing" should be --provided--;

line 13, "whch" should be --which--;

line 64, "for the" should be --for explaining --the--.

Col. 5, line 17, "optoe-" should be --opto- --;

line 18, "lectric" should be --electric--.

Col. 6, line 7, "the" should be --total--.

Col. 8, line 42, "mdoe," should be --mode,--.

Col. 9, line 33, "$da_i$" should be --$\dot{d}a_i$--;

line 37, "$da_i$" should be --$\dot{d}a_i$--.

UNITED STATES PATENT AND TRADEMARK OFFICE
CERTIFICATE OF CORRECTION

PATENT NO. : 4,765,735

DATED : AUGUST 23, 1988

INVENTOR(S) : MASAKAZU MORI ET AL.

It is certified that error appears in the above-identified patent and that said Letters Patent is hereby corrected as shown below:

Col. 10, line 15, the divisor in the equation, "$a_i$" should be --$\overline{a_i}$--.

Col. 11, line 26, "$dA_i|$" should be --$dA_i|^2$--;

line 37, "$pN_{Ai}(t)$" should be --$PNA_i(t)$--;

line 47, "$PN_{Ai}(t)$" should be --$PNA_i(t)$--.

Col. 12, line 8, "n" should be --N--;

line 50, "$(a_i)^2$" should be --$(\overline{a_i})^2$--.

Col. 13, line 56, "cosidered" should be --considered--.

Col. 14, line 17, "$_0^{NT}$" should be --$\int_0^{NT}$--;

line 32, "comples" should be --complex--;

line 61, "(Equation 13), "j" should be -- -j--.

UNITED STATES PATENT AND TRADEMARK OFFICE
CERTIFICATE OF CORRECTION

PATENT NO. : 4,765,735

DATED : AUGUST 23, 1988

INVENTOR(S) : MASAKAZU MORI ET AL.

It is certified that error appears in the above-identified patent and that said Letters Patent is hereby corrected as shown below:

Col. 15, line 7, "exp(j2" should be --·exp(j2--;

line 30, "(N + 1)²/4(NT)²" should be --{(N + 1)/2N}²--.

Col. 16, line 1, "$h_n*\delta(f$" should be --$h_n*\cdot\delta(f$--;

line 20, "($t_o$" should be --(t--;

line 36, "PN" should be --PN ⟶ --;

line 50, "T}/" should be --T)--;

line 63, "t", in the divisor of the exponent should be --T--.

Col. 17, line 33, "said" should be --the--;

line 58, "(n/NT)|" should be --(ṅ/NT)|²--;

line 59, delete "²".

UNITED STATES PATENT AND TRADEMARK OFFICE
CERTIFICATE OF CORRECTION

PATENT NO. : 4,765,735

DATED : AUGUST 23, 1988

INVENTOR(S) : MASAKAZU MORI ET AL.

It is certified that error appears in the above-identified patent and that said Letters Patent is hereby corrected as shown below:

Col. 18, line 3, "$|C_n \cdot C_n)*$" should be --$|C_n \cdot C_n*)$--.

Col. 20, line 8, "mode" should be --modes--;

line 27, delete "said".

Signed and Sealed this

Thirty-first Day of January, 1989

Attest:

DONALD J. QUIGG

Attesting Officer

Commissioner of Patents and Trademarks